(12) United States Patent
Lee

(10) Patent No.: US 8,322,032 B2
(45) Date of Patent: Dec. 4, 2012

(54) SUBSTRATE STRUCTURE AND METHOD FOR MANUFACTURING THE SAME

(75) Inventor: Chih-Cheng Lee, Banchiao (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 189 days.

(21) Appl. No.: 12/720,238

(22) Filed: Mar. 9, 2010

(65) Prior Publication Data

US 2011/0056739 A1 Mar. 10, 2011

(30) Foreign Application Priority Data

Sep. 4, 2009 (TW) ................................. 98129881 A

(51) Int. Cl.
*H05K 3/46* (2006.01)
*H05K 3/42* (2006.01)
*H05K 3/02* (2006.01)

(52) U.S. Cl. .............. 29/852; 29/846; 29/847; 174/262; 174/261

(58) Field of Classification Search ................... 29/830, 29/831, 829, 846–847, 852; 174/255, 260–264
See application file for complete search history.

(56) References Cited

U.S. PATENT DOCUMENTS

| | | | | |
|---|---|---|---|---|
| 4,566,186 A * | 1/1986 | Bauer et al. | ...................... | 29/852 |
| 5,291,274 A * | 3/1994 | Tamura | .............................. | 257/30 |
| 5,637,185 A * | 6/1997 | Murarka et al. | ................... | 438/5 |
| 5,700,383 A * | 12/1997 | Feller et al. | ..................... | 438/645 |
| 5,879,862 A * | 3/1999 | Roh | ............................... | 430/314 |
| 6,214,098 B1 * | 4/2001 | Lee | ...................... | 106/3 |
| 6,411,519 B2 * | 6/2002 | Asai et al. | ...................... | 361/794 |
| 6,434,819 B1 * | 8/2002 | Rokugawa | ........................ | 29/852 |
| 6,440,542 B1 * | 8/2002 | Kariya | .......................... | 428/209 |
| 6,482,743 B1 * | 11/2002 | Sato | ............................... | 438/692 |
| 6,523,258 B2 | 2/2003 | Kawamoto et al. | | |
| 6,757,971 B2 * | 7/2004 | Sinha | ............................... | 29/852 |
| 6,767,616 B2 | 7/2004 | Ooi et al. | | |
| 6,986,198 B2 * | 1/2006 | Fallon et al. | ..................... | 29/830 |
| 7,151,228 B2 * | 12/2006 | Takase et al. | ................. | 174/255 |
| 7,535,095 B1 * | 5/2009 | En et al. | ......................... | 257/701 |
| 7,596,862 B2 * | 10/2009 | Egitto et al. | .................... | 29/847 |
| 8,044,306 B2 * | 10/2011 | Takahashi | ..................... | 174/266 |
| 2003/0006700 A1 * | 1/2003 | Yoneda | ........................ | 313/506 |
| 2005/0146049 A1 * | 7/2005 | Kripesh et al. | ................ | 257/776 |

(Continued)

FOREIGN PATENT DOCUMENTS

CN 1458815 11/2003

(Continued)

*Primary Examiner* — Derris Banks
*Assistant Examiner* — Kaying Kue
(74) *Attorney, Agent, or Firm* — Muncy, Geissler, Olds & Lowe, PLLC

(57) ABSTRACT

A method for manufacturing a substrate structure is provided. The method includes the following steps. A substrate is provided. The substrate has a patterned first metal layer, a pattern second metal layer and a through hole. After that, a first dielectric layer and a second dielectric layer are formed at a first surface and a second surface of the substrate, respectively. The second surface is opposite to the first surface. Then, the first dielectric layer and the second dielectric layer are patterned. After that, a first trace layer is formed at a surface of the patterned first dielectric layer. The first trace layer is embedded into the patterned first dielectric layer and is coplanar with the first dielectric layer. Then, a second trace layer is formed on a surface of the second dielectric layer.

6 Claims, 6 Drawing Sheets

U.S. PATENT DOCUMENTS

| | | | |
|---|---|---|---|
| 2008/0041621 A1* | 2/2008 | Hsu et al. | 174/262 |
| 2008/0189943 A1* | 8/2008 | Hirose et al. | 29/852 |
| 2008/0314632 A1* | 12/2008 | Wu et al. | 174/263 |
| 2009/0166077 A1* | 7/2009 | Hirakawa | 174/262 |
| 2009/0288873 A1* | 11/2009 | Horiuchi et al. | 174/262 |
| 2010/0103634 A1* | 4/2010 | Funaya et al. | 361/761 |
| 2010/0214719 A1* | 8/2010 | Kim et al. | 361/313 |

FOREIGN PATENT DOCUMENTS

| | | |
|---|---|---|
| TW | I292290 | 1/2008 |

* cited by examiner

SUBSTRATE STRUCTURE AND METHOD FOR MANUFACTURING THE SAME

This application claims the benefit of Taiwan application Serial No. 98129881, filed Sep. 4, 2009, the subject matter of which is incorporated herein by reference.

BACKGROUND OF THE INVENTION

1. Field of the Invention

The invention relates in general to a substrate structure and a method for manufacturing the same, and more particularly to a substrate structure with a substrate whose two surfaces has different structures and a method for manufacturing the same.

2. Description of the Related Art

In response to the current trend in slimness, lightweight and compactness of electronic products, the design of the circuit board is gradually directed towards ultrafine lines.

Currently, the circuit board whose top surface and bottom surface both have a trace layer with ultrafine lines is provided. However, two ultrafine line processes have to be performed so as to obtain such a circuit board, so that the cost is extremely high. Thus, how to reduce the cost for manufacturing the circuit board having the trace layers with the ultrafine lines has become one of the imminent issues to the manufacturers.

SUMMARY OF THE INVENTION

The invention is directed to a substrate structure and a method for manufacturing the same. The invention has the advantages of thin thickness and low manufacturing cost.

According to the present invention, a method for manufacturing a substrate structure is provided. The method includes the following steps. A substrate is provided, wherein the substrate has a patterned first metal layer, a patterned second metal layer and a through hole. Next, a first dielectric layer and a second dielectric layer are formed at a first surface and a second surface of the substrate respectively, wherein the second surface is opposite to the first surface. Then, the first dielectric layer and the second dielectric layer are patterned. After that, a first trace layer is formed at a surface of the patterned first dielectric layer, wherein the first trace layer is embedded into the patterned first dielectric layer and is substantially coplanar with the first dielectric layer. Then, a second trace layer is formed on a surface of the second dielectric layer.

According to the present invention, a substrate structure including a substrate, a first dielectric layer, a second dielectric layer, a first trace layer and a second dielectric layer is further provided. The substrate has a patterned first metal layer, a patterned second metal layer and a through hole. The through hole is electrically connected to the first metal layer and the second metal layer. The first dielectric layer is disposed at a first surface of the substrate. The second dielectric layer is disposed at a second surface of the substrate. The first surface is opposite to the second surface. The first trace layer is embedded into the first dielectric layer and is coplanar with the first dielectric layer. The second trace layer is disposed on a surface of the second dielectric layer.

The invention will become apparent from the following detailed description of the preferred but non-limiting embodiments. The following description is made with reference to the accompanying drawings.

DETAILED DESCRIPTION OF THE INVENTION

Figure 1:
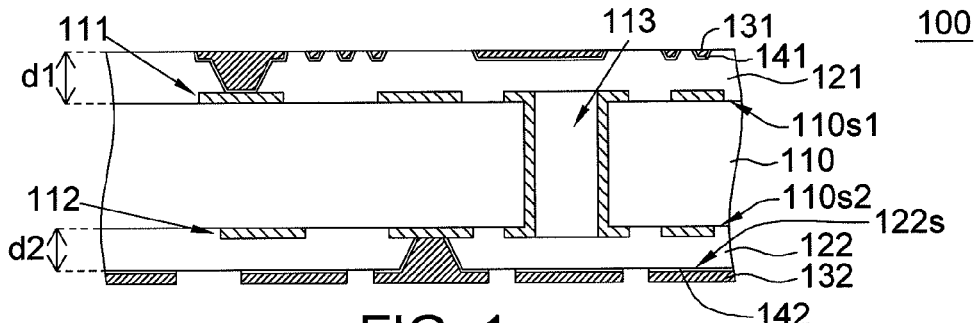
FIG. 1 shows a substrate structure according to a preferred embodiment of the present invention.

Referring to FIG. 1, a substrate structure according to a preferred embodiment of the present invention is shown. The substrate structure 100 includes a substrate 110, a first dielectric layer 121, a second dielectric layer 122, a first trace layer 131 and a second trace layer 132.

The substrate 110 has a patterned first metal layer 111, a patterned second metal layer 112 and a through hole 113. The through hole 113 is electrically connected to the first metal layer 111 and the second metal layer 112. The first dielectric layer 121 is disposed at a first surface 110$s$1 of the substrate 110, and the second dielectric layer 122 is disposed at a second surface 110$s$2 of the substrate 110. The first surface 110$s$1 is opposite to the second surface 110$s$2. The first trace layer 131 is embedded into the first dielectric layer 121 and is coplanar with the first dielectric layer 121. The second trace layer 132 is disposed on a surface 122$s$ of the second dielectric layer 122.

The substrate structure 100 of the present embodiment of the invention is further elaborated below. In the present embodiment of the invention, the first trace layer 131 has ultrafine lines for being electrically connected to a chip. The first trace layer 131 herein is electrically connected to the chip by flip chip technology with tin balls or Cu pillars. The trace pitch of the ultrafine lines ranges from 6 to 30 micrometers, and the thickness of the trace of the ultrafine lines ranges from 5 to 15 micrometers, for example. Besides, the second trace layer 132 with the thickness ranging from 12 to 20 micrometers is disposed at the surface of the second dielectric layer 122, for example. As the first trace layer 131 is embedded into the first dielectric layer 121, the first dielectric layer 121 needs to have certain thickness d1 so that the first trace layer 131 and the trace layer at the first surface 110$s$1 are separated by a certain interval to avoid short-circuiting. As the second trace layer 132 is not embedded into the second dielectric layer 122, the thickness d2 of the second dielectric layer 122 can be designed to be smaller than the thickness d1 of the first dielectric layer 121 so as to reduce the overall thickness of the substrate structure 100. The thickness d1 of the first dielectric layer 121 can be designed to be larger than the thickness d2 of the second dielectric layer 122 by about 10~20 micrometers.

In the present embodiment of the invention, let the first trace layer 131 and the second trace layer 132 be formed by way of electroplating as an example. The substrate structure 100 may further include a first seed layer 141 and a second seed layer 142 used as conductive layers for electroplating. The first seed layer 141 is disposed between the first dielectric layer 121 and the first trace layer 131, and the second seed layer 142 is disposed between the second dielectric layer 122 and the second trace layer 132. The first seed layer 141 and the second seed layer 142 can be made of electroless copper (E'less Cu), for example. Moreover, the substrate structure 100 may further include a number of tin balls disposed on the second trace layer 132 for being electrically connected to the exterior.

Under the presupposition of providing the same functions, compared with the substrate structure whose top surface and bottom surface both have a trace layer with ultrafine lines embedded into the dielectric layer, the substrate structure 100 of the present embodiment of the invention have the trace layers with different structures disposed at the first surface 110s1 and the second surface 110s2 of the substrate 110. Therefore, the overall thickness of the substrate 110 is thinner.

In the present embodiment of the invention, the substrate structure 100 can be manufactured by the following three manufacturing methods elaborated below.

Figure 2:
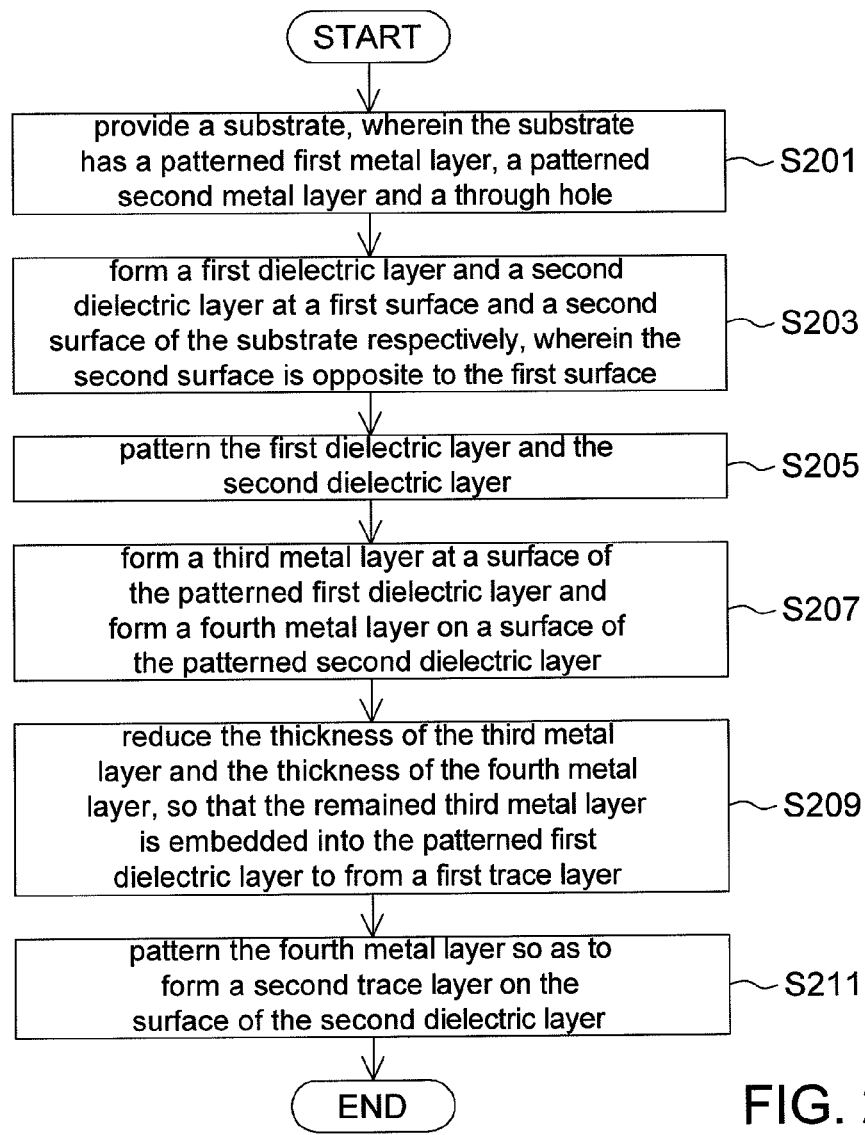
FIG. 2 shows a flowchart of a first method for manufacturing the substrate structure in FIG. 1.

Referring to both FIG. 2 and FIGS. 3A~3F, a flowchart of a first method for manufacturing the substrate structure in FIG. 1 is shown, and the steps of the first method in FIG. 2 for manufacturing the substrate structure are shown in FIGS. 3A~3F. The first method for manufacturing the substrate structure 100 includes the following steps.

Figure 3A:
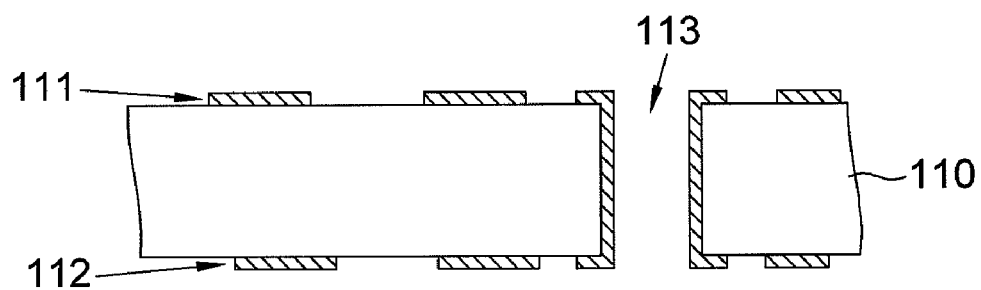
FIGS. 3A~3F show the steps of the first method in FIG. 2 for manufacturing the substrate structure.

In the step S201, the substrate 110 is provided. The substrate 110 has the patterned first metal layer 111, the patterned second metal layer 112 and the through hole 113, as indicated in FIG. 3A. In the present embodiment of the invention, the through hole 113 is electrically connected to the first metal layer 111 and the second metal layer 112. Although the substrate 110 of the present embodiment has the first metal layer 111, the second metal layer 112 and the through hole 113, the substrate 110 can be a substrate (not illustrated) having more than two metal layers.

Figure 3B:
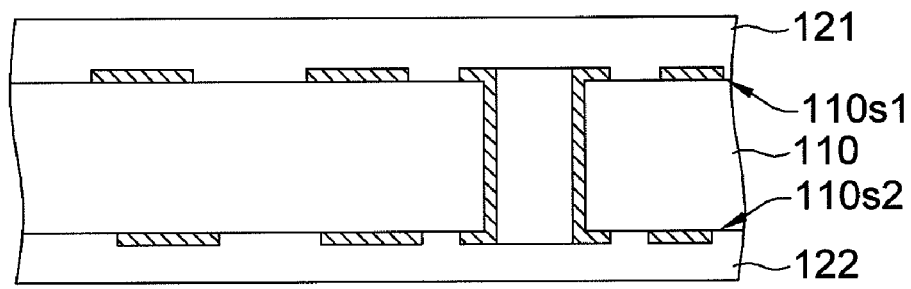

Then, in the step S203, the first dielectric layer 121 and the second dielectric layer 122 are formed at the first surface 110s1 and the second surface 110s2 of the substrate 110 as indicated in FIG. 3B, wherein the first surface 110s1 is opposite to the second surface 110s2. The first dielectric layer 121 and the second dielectric layer 122 are, for example, formed by way of vacuum lamination in the step S203.

Figure 3C:
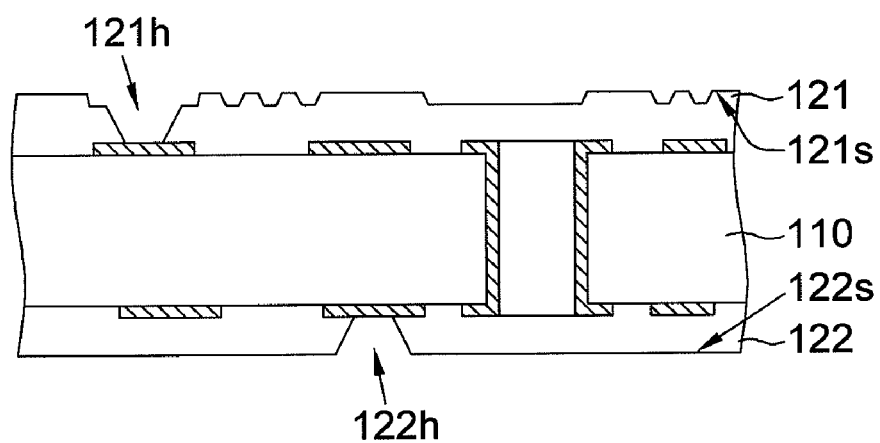

After that, in the step S205, the first dielectric layer 121 and the second dielectric layer 122 are patterned, as indicated in FIG. 3C. The first dielectric layer 121 is, for example, patterned by excimer laser so as to form patterns corresponding to the ultrafine lines of the first trace layer 131, and is patterned by UV-YAG laser so as to form a pattern corresponding to a via 121h of the first dielectric layer 121. Besides, the patterned second dielectric layer 122 is, for example, patterned by UV-YAG laser so as to form a pattern corresponding to a via 122h of the second dielectric layer 122.

Figure 3D:
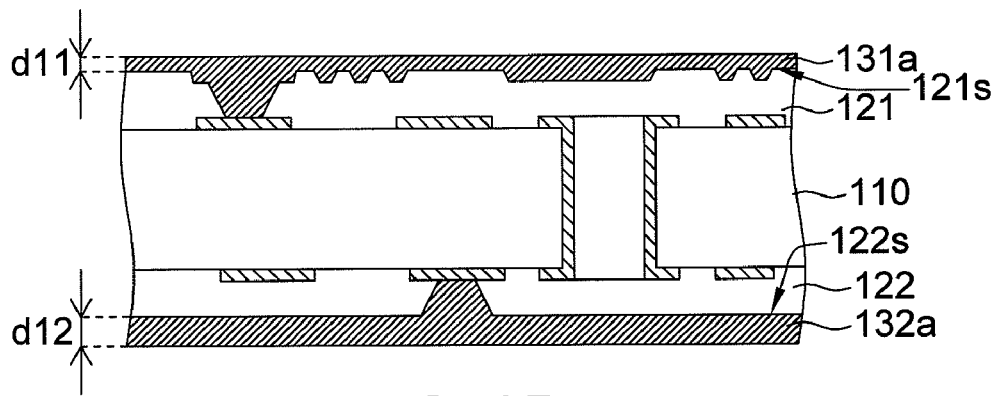

Next, in the step S207, the third metal layer 131a is formed at the surface 121s of the patterned first dielectric layer 121, and the fourth metal layer 132a is formed on the surface 122s of the patterned second dielectric layer 122, as indicated in FIG. 3D. In the present embodiment of the invention, the thickness d12 of the fourth metal layer 132a formed on the surface 122s of the second dielectric layer 122 is preferably larger than the thickness d11 of the third metal layer 131a formed on the surface 121s of the first dielectric layer 121.

Figure 3E:
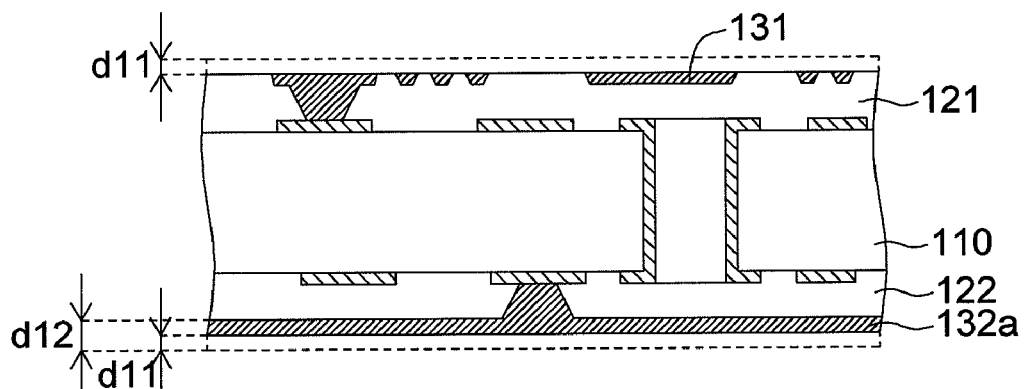

Then, in the step S209, the thickness of the third metal layer 131a is reduced, and the thickness of the fourth metal layer 132a is reduced, so that the remained third metal layer 131a is embedded into the patterned first dielectric layer 121 to from the first trace layer 131, as indicated in FIG. 3E. In the present embodiment, the part of the third metal layer 131a that is higher than the first dielectric layer 121 needs to be reduced, so that only the part of the third metal layer 131a that is embedded into the first dielectric layer 121 is left. As indicated in FIG. 3E, the part of the third metal layer 131a that is reduced and the part of the fourth metal layer 132a that is reduced are denoted by dotted lines. The thickness of the third metal layer 131a and the thickness of the fourth metal layer 132a are, for example, reduced by the same manufacturing process. In the step S209, the thickness of the third metal layer 131a is, for example, reduced by way of etching or grinding, and the thickness of the fourth metal layer 132a is, for example, reduced by way of etching or grinding. In the present embodiment of the invention, the thickness of the reduced third metal layer 131a is substantially equal to the thickness of the reduced fourth metal layer 132a.

Figure 3F:
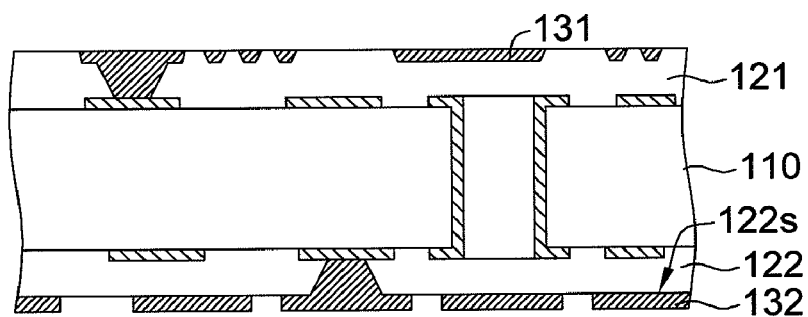

After that, in the step S211, the fourth metal layer 132a is patterned so as to form the second trace layer 132 on the surface 122s of the second dielectric layer 122, as indicated in FIG. 3F.

In order to provide the electrical connection to the exterior, the method of the present embodiment of the invention can further include forming a number of tin balls on the second trace layer 132.

Let the third metal layer 131a and the fourth metal layer 132a are formed by way of electroplating so as to be a part of the first trace layer 131 and the second trace layer 132 respectively in the method of the present embodiment of the invention as an example. In order to provide conductive layers for electroplating, before the step S207, the method for manufacturing the substrate structure 100 further includes forming the first seed layer 141 and the second seed layer 142 (as indicated in FIG. 1) on the surface 121s of the patterned first dielectric layer 121 and the surface 122s of the patterned second dielectric layer 122 in FIG. 3C, respectively. Preferably, after the step S211, the method for manufacturing the substrate structure 100 further includes removing the part of the second seed layer 142 exposed from the second trace layer 132 on the surface 122s of the second dielectric layer 122 so as to avoid short-circuiting. The removing step can be performed by way of etching or downstream pretreatment.

Besides, in order to effectively remove the smear remained on the surface 121s of the first dielectric layer 121 and the surface 122s of the second dielectric layer 122, before the step of forming the first seed layer 141 and the second seed layer 142, the method for manufacturing the substrate structure 100 further includes the step of desmearing the surface 121s of the patterned first dielectric layer 121 and desmearing the surface 122s of the patterned second dielectric layer 122. The desmearing step can be performed by way of etching. The desmearing step removes the smear located on the bottom of the through hole and coarsens the surfaces of the dielectric layers so as to facilitate subsequent processing.

The method for manufacturing the substrate structure 100 uses the excimer laser only when the first dielectric layer 121 is patterned. Using the excimer laser is very costly. Compared with the method for manufacturing a substrate structure that the excimer laser is used twice for patterning two dielectric layers, the method for manufacturing the substrate structure 100 effectively reduces manufacturing cost. Besides, as only the part of the third metal layer 131a that is higher than the first dielectric layer 121 needs to be completely reduced and the thickness of the second dielectric layer 122 can be thinner than the thickness of the first dielectric layer 121, the cost for manufacturing the substrate structure 100 of the present embodiment of the invention can be further reduced.

The second method for manufacturing the substrate structure 100 is disclosed below. The second manufacturing method differs from the first manufacturing method in that the second method for manufacturing the substrate structure 100 changes the thicknesses of the third metal layer and the fourth metal layer. More specifically, compared with the first method for manufacturing the substrate structure 100, in the second method for manufacturing the substrate structure 100, the thickness of the fourth metal layer is not smaller than the thickness of the third metal layer. However, the difference between the thicknesses of the third metal layer and the fourth metal layer formed in the second manufacturing method is smaller than the difference between the thicknesses of the third metal layer 131*a* and the fourth metal layer 132*a* according to the first manufacturing method in FIG. 2. Moreover, the third metal layer undergoes a larger thickness reduction than the fourth metal layer.

For example, in the second manufacturing method, the thickness of the third metal layer is reduced by way of etching and grinding, but the thickness of the fourth metal layer is reduced by way of etching only. Thus, the substrate structure 100 in FIG. 1 is manufactured on the basis of the design of the thicknesses of the third metal layer and the fourth metal layer and the steps similar to those shown in FIG. 3A~FIG. 3F. The second manufacturing method provides the same advantages as those of the first manufacturing method.

The substrate structure 100 can also be manufactured according to the steps indicated in FIG. 4 and FIGS. 5A~5G in addition to the above two manufacturing methods. Referring to FIG. 4 and FIGS. 5A~5G, a flowchart of a third method for manufacturing the substrate structure in FIG. 1 is shown, and the steps of the third method in FIG. 4 for manufacturing the substrate structure are shown. The third method for manufacturing the substrate structure 100 includes the following steps.

Figure 4:
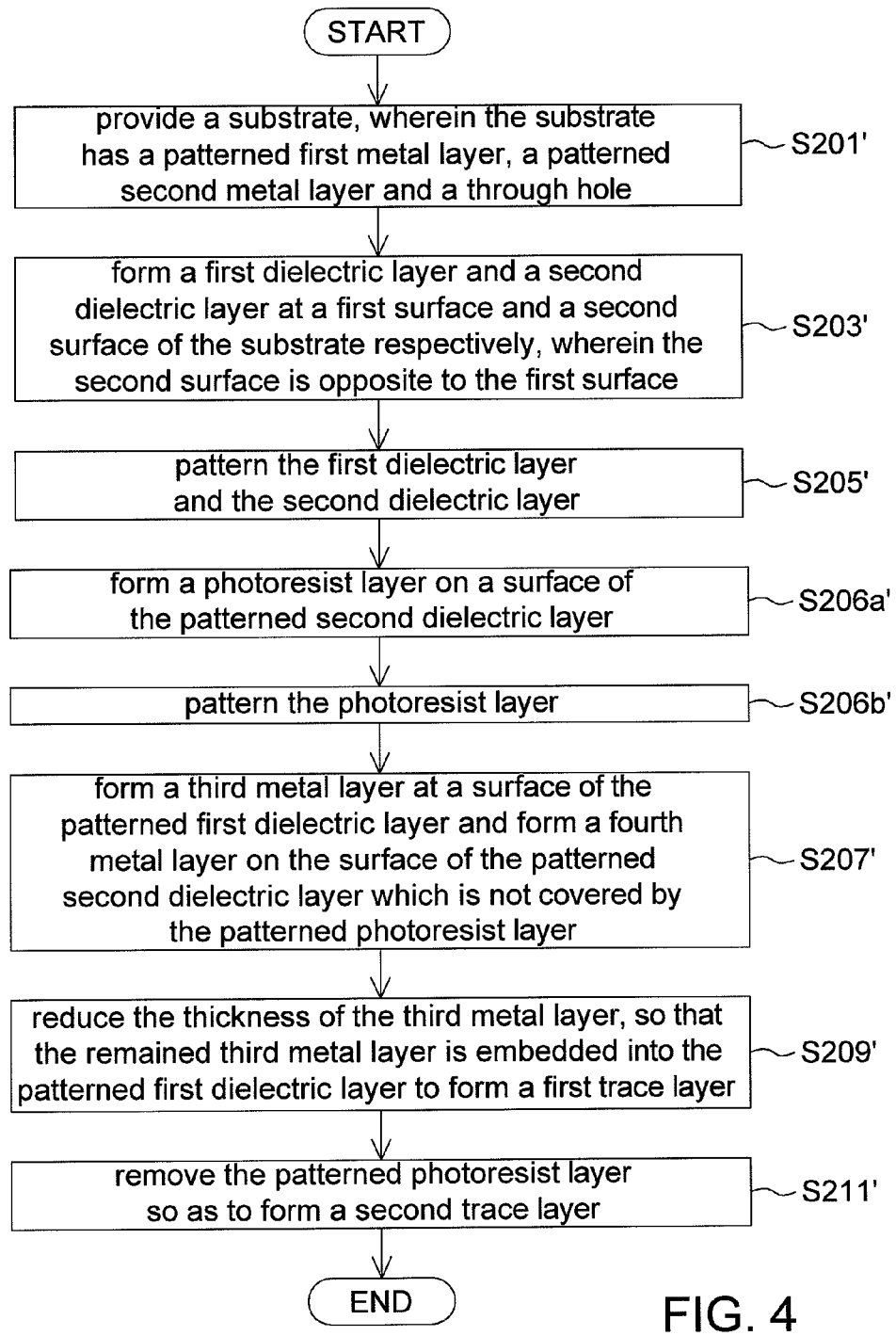
FIG. 4 shows a flowchart of a third method for manufacturing the substrate structure in FIG. 1.
Figure 5A:
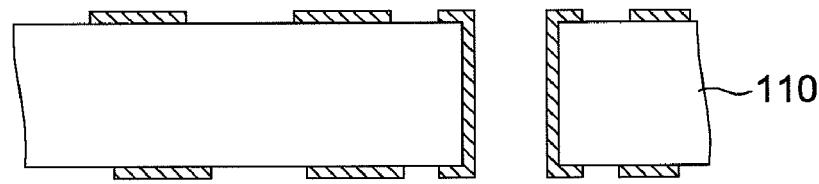
FIGS. 5A~5G show the steps of the third method in FIG. 4 for manufacturing the substrate structure.
Figure 5B:
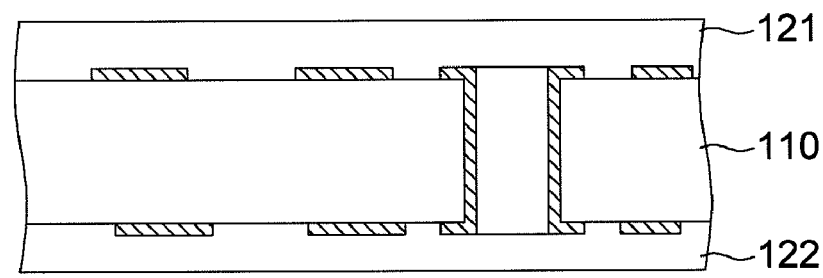
Figure 5C:
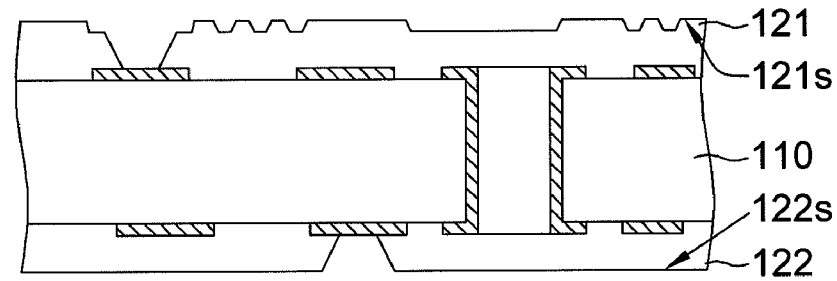

Compare to the steps in FIG. 2, the steps S201' to S205' in FIG. 4 are similar to the steps S201 to S205 in FIG. 2. In the step S201', the substrate 110 is provided (as indicated in FIG. 5A). In the step 203', the first dielectric layer 121 and the second dielectric layer 122 are formed (as indicated in FIG. 5B). In the step S205', the first dielectric layer 121 and the second dielectric layer 122 are patterned (as indicated in FIG. 5C).

Next, in the step S206*a*', the photoresist layer 150 is formed on the surface 122*s* of the patterned second dielectric layer 122. Specifically, the photoresist layer 150 is formed on a seed layer (not shown) previously formed on the surface 122*s* of the patterned second dielectric layer 122.

Figure 5D:
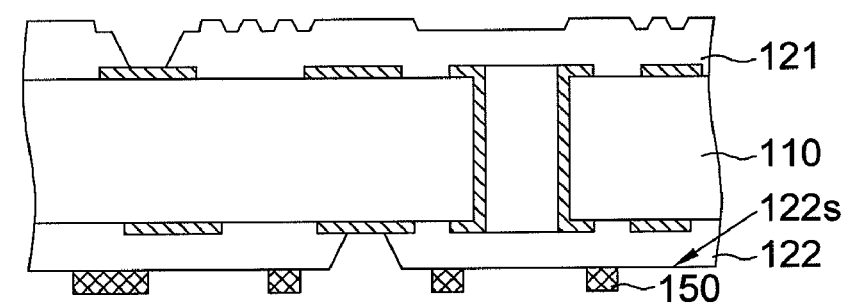

Then, in the step S206*b*', the photoresist layer 150 is patterned, as indicated in FIG. 5D.

Figure 5E:
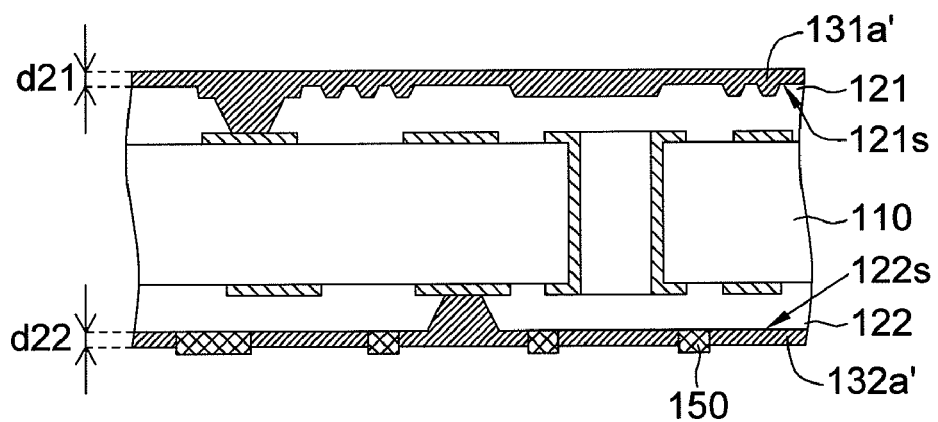

After that, in the step S207', the third metal layer 131*a*' is formed at the surface 121*s* of the patterned first dielectric layer 121, and the fourth metal layer 132*a*' is formed on the surface 122*s* of the patterned second dielectric layer 122 (specifically, the seed layer 142 (not shown)) which is not covered by the patterned photoresist layer 150 as indicated in FIG. 5E. In the present embodiment of the invention, the thickness d22 of the formed fourth metal layer 132*a*'can be substantially equal to the thickness d21 of the formed third metal layer 131*a*'.

Figure 5F:
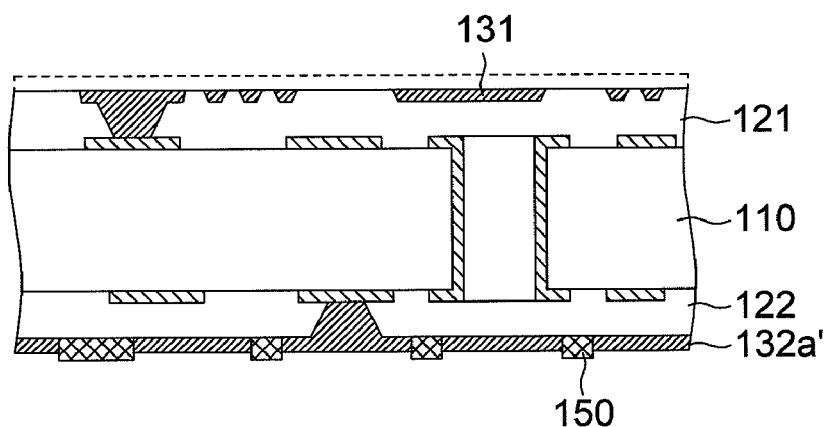

Then, in the step S209', the thickness of the third metal layer 131*a*' is reduced, so that the remained third metal layer 131*a*' is embedded into the patterned first dielectric layer 121 to form the first trace layer 131 as indicated in FIG. 5F. The part of the reduced third metal layer 131*a*' is denoted by dotted lines. In the step S207', the thickness of the third metal layer 131*a*' is, for example, reduced by way of etching and grinding.

Figure 5G:
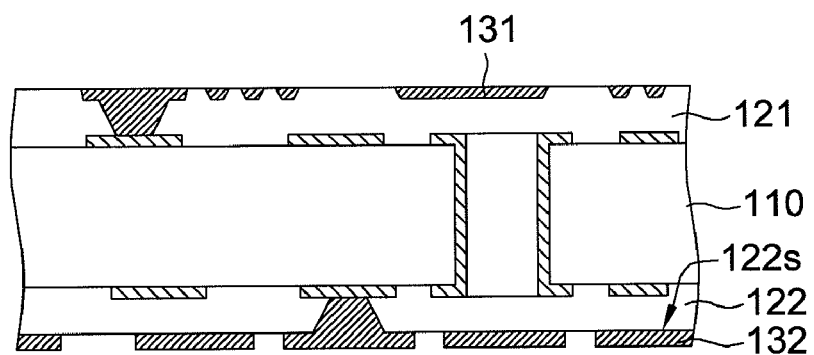

After that, in the step S211', the patterned photoresist layer 150 is removed so as to form the second trace layer 132 as indicated in FIG. 5G.

In order to provide the electrical connection to the exterior, the method of the present embodiment of the invention can further include forming a number of tin balls on the second trace layer 132.

Other steps such as the step of desmearing the first dielectric layer 121 and the second dielectric layer 122 and the step of forming the first seed layer 141 and the second seed layer 142 can be performed according to the requirements during the manufacturing process, and are not repeatedly described herein. The third manufacturing method can provides the same advantages as those of the first manufacturing method.

According to the substrate structure and the method for manufacturing the same disclosed in the above embodiments of the invention, the first trace layer is embedded into the first dielectric layer, and the second trace layer is disposed on the second dielectric layer. Compared with the substrate structure whose top surface and bottom surface both have a trace layer with the ultrafine lines embedded into the dielectric layer, the overall thickness of the substrate structure of the embodiments of the invention is thinner, and the manufacturing cost is lower. Besides, the trace layer disposed at the bottom surface of the substrate is normally used as a grounding layer or a direct current bias layer and can achieve the desired function without ultrafine lines. In the embodiments of the present invention, ordinary trace layer (such as the second trace layer 132) can be used as the grounding layer or the direct current bias layer. Therefore, on the premise that the product requirements are satisfied, the embodiments of the present invention have the advantages of low cost and strong competitiveness in the market.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method for manufacturing a substrate structure, comprising:

providing a substrate, wherein the substrate has a patterned first metal layer, a patterned second metal layer and a through hole;

forming a first dielectric layer and a second dielectric layer at a first surface and a second surface of the substrate respectively, wherein the second surface is opposite to the first surface;

patterning the first dielectric layer and the second dielectric layer;

forming a first trace layer at a surface of the patterned first dielectric layer, wherein the first trace layer is embedded into the patterned first dielectric layer and is coplanar with the first dielectric layer, comprising:

forming a third metal layer at the surface of the patterned first dielectric layer; and reducing the thickness of the third metal layer, so that the remained third metal layer is embedded into the patterned first dielectric layer to form the first trace layer; and forming a second trace layer on a surface of the second dielectric layer, comprising:

forming a fourth metal layer on the surface of the patterned second dielectric layer;

reducing the thickness of the fourth metal layer, wherein the step of reducing the thickness of the fourth metal layer and the step of reducing the thickness of the third metal layer are in an etching step; and patterning the fourth metal layer so as to form the second trace layer, wherein the thickness of the formed fourth metal layer is larger than the thickness of the formed third metal layer, and the thickness of the reduced third metal layer is substantially equal to the thickness of the reduced fourth metal layer.

2. The method according to claim 1, wherein the step of forming the second trace layer comprises:
   forming a seed layer on the surface of the patterned second dielectric layer;
   forming a photoresist layer on a surface of the seed layer;
   patterning the photoresist layer;
   forming the fourth metal layer on the surface of the seed layer which is not covered by the patterned photoresist layer; and
   removing the patterned photoresist layer and the seed layer not covered by the fourth metal layer so as to form the second trace layer.

3. The method according to claim 2, wherein before the step of forming the seed layer, the method further comprises:
   desmearing the surface of the patterned second dielectric layer.

4. The method according to claim 1, wherein the step of patterning the first dielectric layer and the second dielectric layer is performed by using UV-YAG laser so as to form patterns corresponding to vias of the first dielectric layer and the second dielectric layer respectively.

5. The method according to claim 1, wherein the thickness of the first dielectric layer is larger than the thickness of the second dielectric layer.

6. The method according to claim 5, wherein the thickness of the first dielectric layer is larger than the thickness of the second dielectric layer by 10~20 micrometers.

* * * * *